United States Patent
Lin et al.

(10) Patent No.: US 9,031,625 B2
(45) Date of Patent: *May 12, 2015

(54) SUPERCONDUCTING WIRE

(71) Applicants: Tsinghua University, Beijing (CN); Hon Hai Precision Industry Co., Ltd., New Taipei (TW)

(72) Inventors: Xiao-Yang Lin, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/727,531

(22) Filed: Dec. 26, 2012

(65) Prior Publication Data

US 2013/0331270 A1    Dec. 12, 2013

(30) Foreign Application Priority Data

Jun. 7, 2012 (CN) .......................... 2012 1 0185726

(51) Int. Cl.
| H01B 12/02 | (2006.01) |
| H01B 12/06 | (2006.01) |
| H01L 39/24 | (2006.01) |
| H01L 39/14 | (2006.01) |

(52) U.S. Cl.
CPC ............... *H01B 12/02* (2013.01); *Y02E 40/641* (2013.01); *H01L 39/248* (2013.01); *H01L 39/143* (2013.01); *Y02E 40/642* (2013.01)

(58) Field of Classification Search
CPC ........ H01B 12/00; H01B 12/02; H01B 12/06; H01L 39/00; H01L 39/02; H01L 39/14; H01L 39/123; H01L 39/136; H01L 39/24; H01L 39/248; C01B 31/02; C01B 31/022; C01B 31/04; C01B 31/0484
USPC ......... 505/100, 110, 150, 230, 233, 430, 434, 505/470, 704; 174/125.1; 29/599; 427/62; 423/447.1, 447.3, 445 B
See application file for complete search history.

(56) References Cited

U.S. PATENT DOCUMENTS

| 4,808,954 A | 2/1989 | Ito |
| 5,227,720 A | 7/1993 | Gross et al. |
| 2002/0068682 A1 | 6/2002 | Shen |
| 2008/0004184 A1 | 1/2008 | Ohmatsu |
| 2008/0170982 A1* | 7/2008 | Zhang et al. ............... 423/447.3 |
| 2010/0197505 A1* | 8/2010 | Steinmeyer et al. .......... 505/230 |
| 2012/0100203 A1* | 4/2012 | Fang et al. .................... 424/443 |

FOREIGN PATENT DOCUMENTS

| CN | 100559514 | 11/2009 |
| TW | 452992 | 9/2001 |
| TW | 200721200 | 6/2007 |
| WO | WO 2011/005375 | * 1/2011 .......... H01L 31/0264 |

* cited by examiner

*Primary Examiner* — Stanley Silverman
*Assistant Examiner* — Kallambella Vijayakumar
(74) *Attorney, Agent, or Firm* — Novak Druce Connolly Bove + Quigg LLP

(57) ABSTRACT

A superconducting wire includes a linear superconductor and a carbon nanotube structure. The carbon nanotube structure is located on the linear superconductor. The carbon nanotube structure includes a number of carbon nanotubes joined end to end by van der Waals attractive force between and arranged helically along an axial direction of the linear superconductor.

6 Claims, 11 Drawing Sheets

SUPERCONDUCTING WIRE

CROSS-REFERENCE TO RELATED APPLICATIONS

This application claims all benefits accruing under 35 U.S.C. §119 from China Patent Applications: Application No. 201210185726.8, filed on Jun. 7, 2012 in the China Intellectual Property Office, disclosures of which are incorporated herein by references. This application is related to applications entitled, "METHOD FOR MAKING SUPERCONDUCTING WIRE", with U.S. Ser. No. 13/727,555, filed 26 Dec. 2012, now U.S. Pat. No. Ser. 8,871,685filed; "METHOD FOR MAKING SUPERCONDUCTING WIRE", with U.S. Ser. No. 13/727,578, filed 26 Dec. 2012; "SUPERCONDUCTING WIRE", with U.S. Ser. No. 13/727,583, filed 26 Dec. 2012.

BACKGROUND

1. Technical Field

The present disclosure relates to superconducting wires and methods for making the same.

2. Description of Related Art

A superconductor is a material that can conduct electricity or transport electrons from one atom to another with no resistance. This means no heat, sound, or any other form of energy would be released from the material when it has reached "critical temperature" (Tc). Superconductors can be widely applied to a field such as power generation, power transmission, and energy storage.

In US2003130128A1 published on Jul. 10, 2003, Han discloses a method for making a superconducting wire. The method includes steps of: dissolving fine superconducting precursor powder in an organic solvent to form a mixture; coating the mixture on a silver wire or silver alloy wire; and sintering the wire coated with the mixture on a low temperature and a high temperature respectively to obtain a superconducting wire. Furthermore, the superconducting wire can be rolled to a desired size. However, a plurality of micropores will result in the superconducting wire because removing the organic solvent completely in subsequent processing is difficult. Furthermore, the strength of the silver wire or silver alloy wire is not high enough to suffer the processing of sintering and rolling.

What is needed, therefore, is to provide an improved superconducting wire and a method for making the same.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present superconducting wires and methods for making the same.

Figure 1:
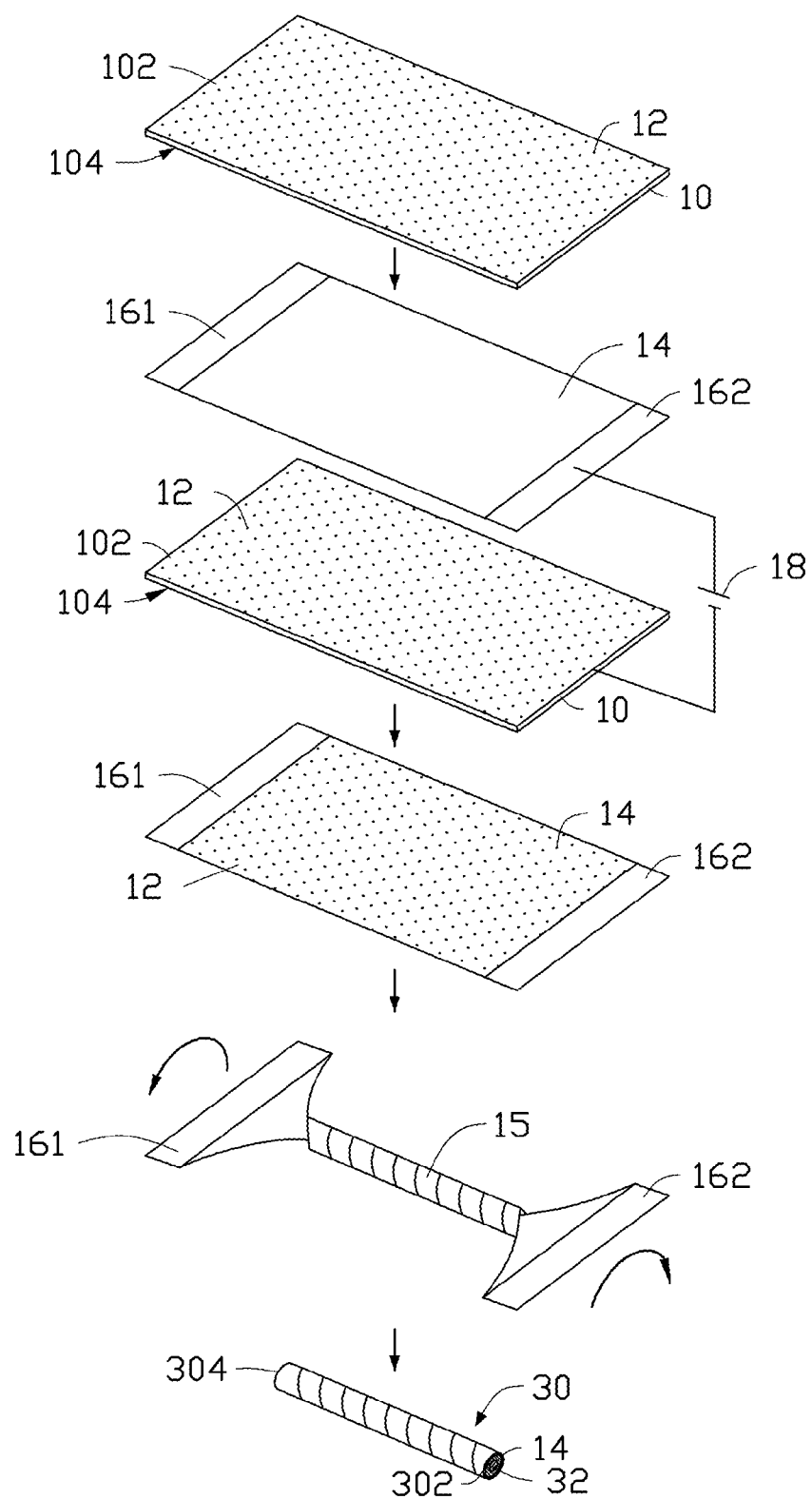
FIG. 1 is a flowchart of one embodiment of a method for making a superconducting wire.

Referring to FIG. 1, a method for making a superconducting wire 30 of one embodiment includes the following steps:

step (S11), providing a plurality of superconducting preforms 12 on a carrier 10;

step (S12), placing a carbon nanotube layer 14 spaced from and opposite to the carrier 10, wherein the plurality of superconducting preforms 12 are between the carbon nanotube layer 14 and the carrier 10;

step (S13), moving the plurality of superconducting preforms 12 from the carrier 10 onto the carbon nanotube layer 14 by applying an electric field between the carbon nanotube layer 14 and the carrier 10;

step (S14), making a composite wire 15 by twisting the carbon nanotube layer 14 with the plurality of superconducting preforms 12 thereon; and step (S15), sintering the composite wire 15.

In step (S11), the carrier 10 can be a conductive plate or an insulative plate having conductive film thereon. The carrier 10 can be made of metal, alloy, polymer, ceramic or glass. The carrier 10 can be sheet shaped and have a first surface 102 and a second surface 104 opposite to the first surface 102. The first surface 102 and the second surface 104 can be flat or curved. The carrier 10 can also form a vessel. In one embodiment, the carrier 10 is a metal plate, and both the first surface 102 and the second surface 104 are flat.

The plurality of superconducting preforms 12 can be in the form of powder or grains. The average diameters of the plurality of superconducting preforms 12 can be in a range from about 50 nanometers to about 5 micrometers. The plurality of superconducting preforms 12 can be formed on at least one of the first surface 102 and the second surface 104 of the carrier 10 by the method of spraying or sowing. If the carrier 10 is a vessel, the plurality of superconducting preforms 12 can be carried in the vessel. In one embodiment, the plurality of superconducting preforms 12 are uniformly sowed on the first surface 102 of the carrier 10.

The plurality of superconducting preforms 12 can be made of superconducting precursors such as bismuth oxide, lanthanum barium copper oxide, yttrium barium copper oxide composite, thallium barium calcium copper oxide composite, copper oxide, or gold-indium alloy. Alternatively, the plurality of superconducting preforms 12 can be superconducting composite made from sintering the superconducting precursors above. In one embodiment, the plurality of superconducting preforms 12 are yttrium barium copper oxide composite with an average diameter in a range from about 500 nanometers to about 2 micrometers.

In step (S12), the carbon nanotube layer 14 is suspended above the carrier 10 by at least one support. In one embodiment, the support can be a plate with an area greater than the area of the carbon nanotube layer 14.

In one embodiment, the carbon nanotube layer 14 is suspended above the carrier 10 by a first support 161 and a second support 162. The first support 161 and the second support 162 are spaced from each other. Two opposite sides of the carbon nanotube layer 14 are attached on the first support 161 and the second support 162. The first support 161 and the second support 162 can be made of conductive material such as metal or alloy. The first support 161 and the second support 162 can be clips to fix the carbon nanotube layer 14. In one embodiment, the first support 161 and the second support 162 are two metal sheets with the width same as the width of the carbon nanotube layer 14.

The carbon nanotube layer 14 can be attached to the first support 161 and the second support 162 by a conductive adhesive (not shown), such as an inorganic adhesive, or an organic adhesive. The viscosity of the conductive adhesive is greater than 1 Pa·second. The organic adhesive can be made of polymer such as phenol resin (PF), epoxy resin (EP), polyurethane (PU), polystyrene (PS), polymethyl methacrylate (PMMA), polycarbonate (PC), polyethylene terephthalate (PET), the benzenepropanoic ring butene (BCB), or polycycloolefin. In one embodiment, the conductive adhesive is silver adhesive.

The carbon nanotube layer 14 is spaced from the carrier 10 and faces the plurality of superconducting preforms 12. The plurality of superconducting preforms 12 are between the carrier 10 and the carbon nanotube layer 14. The distance between the carbon nanotube layer 14 and the plurality of superconducting preforms 12 can be in a range from about 100 micrometers to about 1 centimeter.

The carbon nanotube layer 14 is a free-standing structure. The term "free-standing structure" includes, but is not limited to, the fact that the carbon nanotube layer 14 can sustain the weight of itself when it is hoisted by a portion thereof without any significant damage to its structural integrity. Thus, the carbon nanotube layer 14 can be suspended by the first support 161 and the second support 162.

The carbon nanotube layer 14 includes a plurality of carbon nanotubes. The carbon nanotubes in the carbon nanotube layer 14 can be single-walled, double-walled, or multi-walled carbon nanotubes. The diameter of the single-walled carbon nanotube is in a range from about 0.5 nanometers to about 50 nanometers. The diameter of the double-walled carbon nanotube is in a range from about 1.0 nanometer to about 50 nanometers. The diameter of the multi-walled carbon nanotube is in a range from about 1.5 nanometers to about 50 nanometers. The length and diameter of the carbon nanotubes can be selected according to need. The carbon nanotube layer 14 can be a substantially pure structure consisting of the plurality of carbon nanotubes, with few impurities and chemical functional groups. Because the specific surface of the carbon nanotube layer 14 is large enough, the carbon nanotube layer 14 is adhesive and can be directly adhered to a surface of first support 161 and the second support 162.

The carbon nanotubes of the carbon nanotube layer 14 can be orderly arranged to form an ordered carbon nanotube structure or disorderly arranged to form a disordered carbon nanotube structure. The term 'disordered carbon nanotube structure' includes, but is not limited to, a structure wherein the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure wherein the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The thickness of the carbon nanotube layer 14 can be in a range from about 0.5 nanometers to about 10 micrometers. For example, the thickness of the carbon nanotube layer 14 can be about 10 nanometers, about 100 nanometers, about 200 nanometers, about 1 micrometer, or about 5 micrometers.

The carbon nanotube layer 14 can include a single carbon nanotube film, a plurality of carbon nanotube films stacked with each other or a plurality of coplanar with each other. The carbon nanotube film can be a drawn carbon nanotube film, a flocculated carbon nanotube film or a pressed carbon nanotube film. It is understood that any carbon nanotube structure described can be used with all embodiments.

In one embodiment, the carbon nanotube film is a drawn carbon nanotube film, and the drawn carbon nanotube film are made by following substeps:

step (S121), providing a carbon nanotube array on a substrate; and step (S122), pulling out the drawn carbon nanotube film from the carbon nanotube array by using a tool.

In step (S121), the carbon nanotube array includes a plurality of carbon nanotubes that are parallel to each other and substantially perpendicular to the substrate. The height of the plurality of carbon nanotubes can be in a range from about 50 micrometers to 900 micrometers. The carbon nanotube array can be formed by the substeps of: step (S1211) providing a substantially flat and smooth substrate; step (S1212) forming a catalyst layer on the substrate; step (S1213) annealing the substrate with the catalyst layer in air at a temperature approximately ranging from 700° C. to 900° C. for about 30 to 90 minutes; step (S1214) heating the substrate with the catalyst layer to a temperature approximately ranging from 500° C. to 740° C. in a furnace with a protective gas therein; and step (S1215) supplying a carbon source gas to the furnace for about 5 to 30 minutes and growing the carbon nanotube array on the substrate.

In step (S1211), the substrate can be a P-type silicon wafer, an N-type silicon wafer, or a silicon wafer with a film of silicon dioxide thereon. A 4-inch P-type silicon wafer is used as the substrate. In step (S1212), the catalyst can be made of iron (Fe), cobalt (Co), nickel (Ni), or any alloy thereof. In step (S1213), the protective gas can be made up of at least one of nitrogen ($N_2$), ammonia ($NH_3$), and a noble gas. In step (S1215), the carbon source gas can be a hydrocarbon gas, such as ethylene ($C_2H_4$), methane ($CH_4$), acetylene ($C_2H_2$), ethane ($C_2H_6$), or any combination thereof. The carbon nanotube array formed under the above conditions is essentially free of impurities, such as carbonaceous or residual catalyst particles.

In step (S122), the pulling out the drawn carbon nanotube film includes the substeps of: step (S1221) selecting one or more of carbon nanotubes in a predetermined width from the carbon nanotube array; and step (S1222) pulling the selected carbon nanotubes to form nanotube segments at an even and uniform speed to achieve the drawn carbon nanotube film.

In step (S1221), the carbon nanotubes having a predetermined width can be selected by using an adhesive tape, such as the tool, to contact the super-aligned array. In step (S1222), the pulling direction is substantially perpendicular to the growing direction of the carbon nanotube array. Each carbon nanotube segment includes a plurality of carbon nanotubes parallel to each other.

Figure 2:
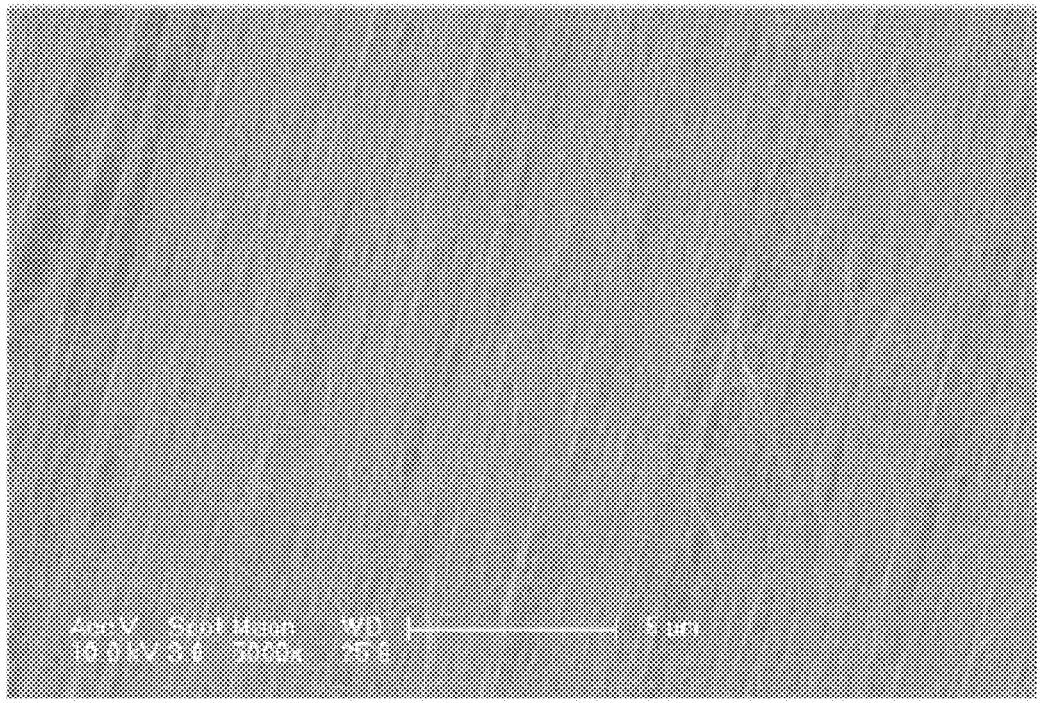
FIG. 2 is a Scanning Electron Microscope (SEM) image of one embodiment of a drawn carbon nanotube film.

More specifically, during the pulling process, as the initial carbon nanotube segments are drawn out, other carbon nanotube segments are also drawn out end-to-end due to van der Waals attractive force between ends of adjacent segments. This process of drawing helps provide a continuous and uniform drawn carbon nanotube film having a predetermined width can be formed. Referring to FIG. 2, the drawn carbon nanotube film includes a plurality of carbon nanotubes joined ends to ends.

The width of the drawn carbon nanotube film depends on a size of the carbon nanotube array. The length of the drawn carbon nanotube film can be arbitrarily set as desired. In one useful embodiment, when the substrate is a 4-inch P-type silicon wafer, the width of the drawn carbon nanotube film can be in a range from about 0.01 centimeters to about 10 centimeters, while the thickness of the drawn carbon nanotube film can be in a range from about 0.5 nanometers to about 10 micrometers.

In one embodiment, the carbon nanotube film is a flocculated carbon nanotube film, and the flocculated carbon nanotube film are made by following substeps:

step (S123), providing a plurality of carbon nanotubes;

step (S124), adding the plurality of carbon nanotubes to a solvent to get a flocculent structure;

step (S125), separating the flocculent structure from the solvent; and step (S126), shaping the separated flocculent structure.

In step (S123), the plurality of carbon nanotubes can be made by chemical vapor deposition (CVD), laser ablation, or arc-charge. In one embodiment, the plurality of carbon nanotubes are obtained by scraping the carbon nanotube array from the substrate as provided in step (S121). The plurality of carbon nanotubes can maintain a bundled state.

In step (S124), the solvent can be water or volatile organic solvent. After the plurality of carbon nanotubes are added into the solvent, a process of flocculent is executed to get the flocculent structure. The process of flocculent can be performed by ultrasonic dispersion and agitating/vibrating. In one embodiment ultrasonic dispersion is used to flocculate the solvent containing the carbon nanotubes for about 10 minutes to 30 minutes. Due to the carbon nanotubes in the solvent having a large specific surface area and the bundled carbon nanotubes having a large van der Waals attractive force, the flocculated and bundled carbon nanotubes form a network structure.

In step (S125), the process of separating the flocculent structure from the solvent includes the substeps of: step (S1251) pouring the solvent containing the flocculent structure through a filter into a funnel; and step (S1252) drying the flocculent structure on the filter to obtain the separated flocculent structure of carbon nanotubes.

Figure 3:
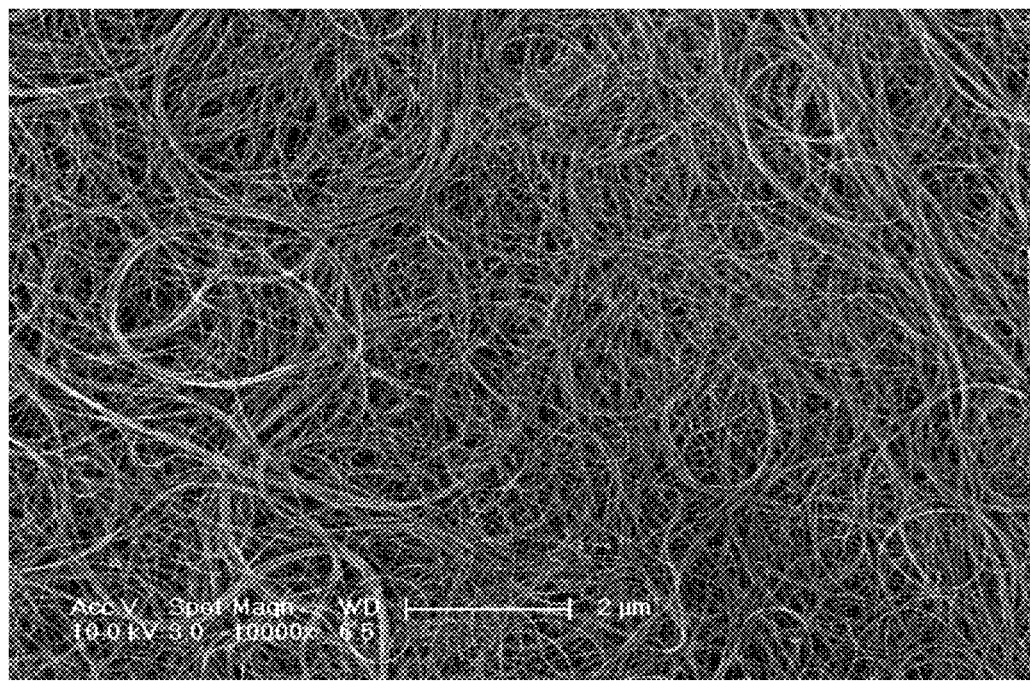
FIG. 3 is an SEM image of one embodiment of a flocculated carbon nanotube film.
Figure 4:
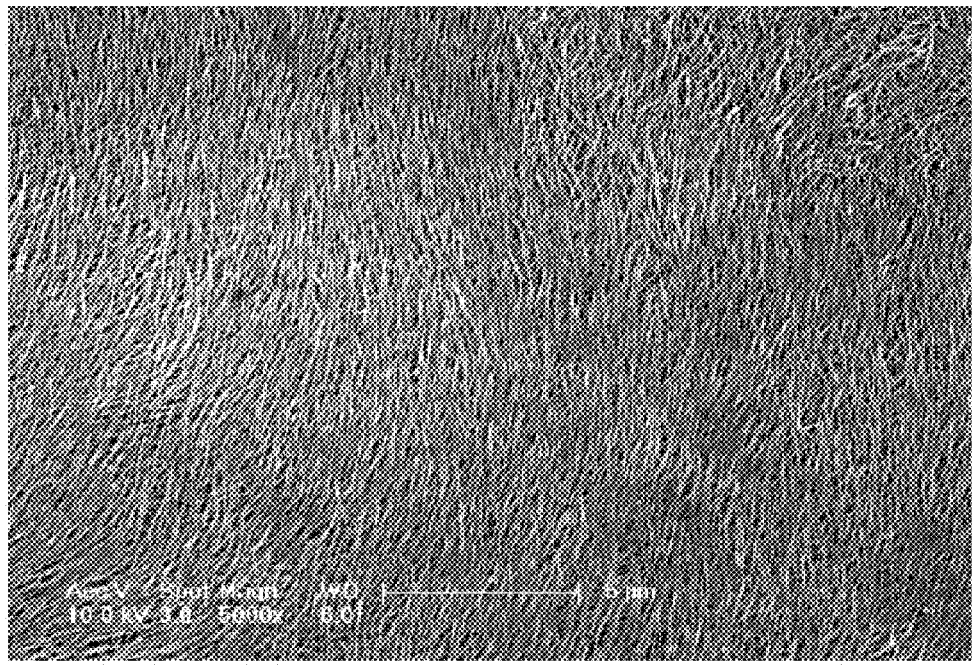
FIG. 4 is an SEM image of one embodiment of a pressed carbon nanotube film.

In step (S126), the shaping the separated flocculent structure includes the substeps of: step (S1261) putting the separated flocculent structure into a container, and spreading the flocculent structure to form a predetermined structure; step (S1262) pressing the spread flocculent structure with a certain pressure to yield a desirable shape; and step (S1263) drying the spread flocculent structure to remove the residual solvent or volatilizing the residual solvent to form a flocculent carbon nanotube film. Referring to FIG. 3, the flocculated carbon nanotube film includes a plurality of carbon nanotubes entangled with each other.

In one embodiment, the carbon nanotube film is a pressed carbon nanotube film, and the pressed carbon nanotube film are made by following substeps:

step (S127), providing a carbon nanotube array; and step (S128), pressing the carbon nanotube array.

In step (S127), the carbon nanotube array is the carbon nanotube array on the substrate as provided in step (S121).

In step (S128), a pressure is applied to the carbon nanotube array by a pressing device, and the carbon nanotubes in the carbon nanotube array form the pressed carbon nanotube film under pressure.

As shown in FIG. 3, the carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure applied, the smaller the angle formed.

The carbon nanotube layer 14 can be treated by an organic solvent. The organic solvent is volatilizable, such as ethanol, methanol, acetone, chloroform, or propanol. In one embodiment, the organic solvent is ethanol. The carbon nanotube layer 14 can be treated by dripping the ethanol onto the surface of the carbon nanotube layer 14 or soaking the entire carbon nanotube layer 14 in the ethanol.

The length of the superconducting wire 30 depends on the length of the carbon nanotube layer 14. In one embodiment, the length of the superconducting wire 30 is in a range from about 1 centimeter to about 10 centimeters.

In step (S13), the plurality of superconducting preforms 12 are absorbed on the surface of the carbon nanotube layer 14 to form a composite film. In one embodiment, the step (S13) is performed in a vacuum to prevent the carbon nanotube layer 14 from being etched by the ions formed by ionizing the gas around the carbon nanotube layer 14.

The electric field is applied between the carbon nanotube layer 14 and the carrier 10 via a power source 18. The power source 18 is electrically connected to the carbon nanotube layer 14 through the second support 162 and electrically connected to the carrier 10 directly. In one embodiment, the power source 18 is a pulse power. After the electric field is applied, the carbon nanotube layer 14 and the plurality of superconducting preforms 12 will be charged with opposite charges attractive with each other. Thus, the plurality of superconducting preforms 12 will move from the carrier 10 to the carbon nanotube layer 14 under the Coulomb force.

In one embodiment, the positive electrode of the power source 18 is electrically connected to the second support 162 so that the carbon nanotube layer 14 will be charged with positive charges. The negative electrode of the power source 18 is electrically connected to the carrier 10 so that the plurality of superconducting preforms 12 will be charged with negative charges. The voltage applied by the power source 18 depends on the distance between the carbon nanotube layer 14 and the plurality of superconducting preforms 12. The voltage applied by the power source 18 can be in a range from about 10 mV to 1000 V. The power source 18 has a pulse time in a range from about 0.1 seconds to about 1 second.

Furthermore, a step of overturning the carbon nanotube layer 14 can be performed after the electric field is applied for a certain time so that the plurality of superconducting preforms 12 can be attached to two opposite surfaces of the carbon nanotube layer 14.

In step (S14), the carbon nanotube layer 14 with the plurality of superconducting preforms 12 thereon is twisted by turning the first support 161 and the second support 162 in two opposite directions. For example, the first support 161 is stationary, and the second support 162 is turned. In another example, the first support 161 and the second support 162 are turned at the same time. The turning cycle depends on the length of the carbon nanotube layer 14. In one embodiment, the length of the carbon nanotube layer 14 is about 1 meter, and the turning cycle is in a range from about 1000 to about 1500. After twisting, the carbon nanotube layer 14 will form a twisted carbon nanotube wire, and the plurality of superconducting preforms 12 are combined together to form a composite wire 15 with the twisted carbon nanotube wire.

Furthermore, the carbon nanotube layer 14 can be under tension by stretching along the extending direction of the carbon nanotubes of the carbon nanotube layer 14 before and during twisting into the composite wire 15. Thus, the gaps between the adjacent two parallel carbon nanotubes will be narrowed. The stretching force depends on the width of the carbon nanotube layer 14. In one embodiment, the stretching force F the width L of the carbon nanotube layer 14 satisfies 0.005 N/cm<F/L<0.02 N/cm.

Furthermore, a step of cutting the composite wire 15 can be performed before sintering the composite wire 15. The composite wire 15 is cut off from the first support 161 and the second support 162 and cut into a certain length. The cutting can be performed by an ion beam, electron beam, or blade.

Figure 7:
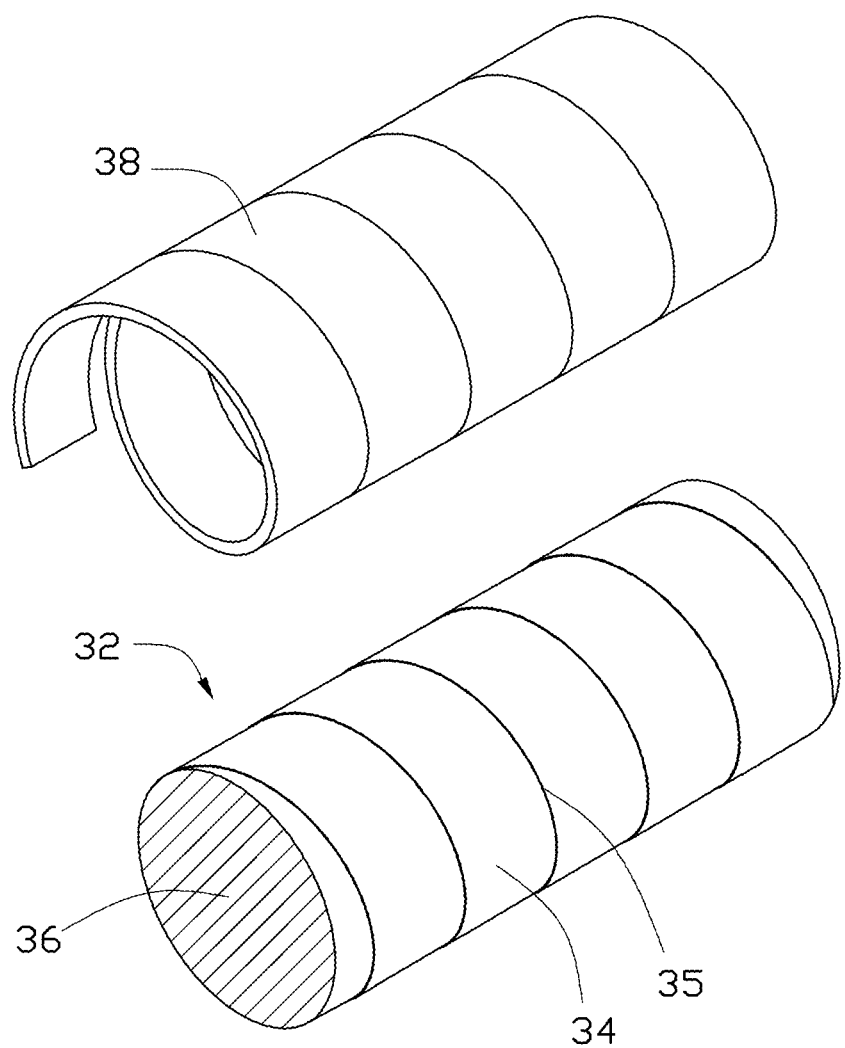
FIG. 7 is an exploded view of the superconducting wire of FIG. 6.

In step (S15), the composite wire 15 is sintered in a chamber such as a quartz tube. The sintering can be performed by heating the chamber using a furnace or supplying a current through the composite wire 15. Because the carbon nanotubes of the composite wire 15 have a high electric-thermal conversion efficiency, the composite wire 15 can be heated uniformly by the heat produced by itself. The chamber can be a vacuum or filled with gas such as air. The gas flow introduced into the chamber can be controlled. The plurality of superconducting preforms 12 are fused and combined with each other to form a linear superconductor 32 as shown in FIG. 7 during the sintering process.

In one embodiment, the composite wire 15 is sintered in a chamber free of oxygen gas on a temperature below 600° C. The plurality of superconducting preforms 12 are fused and combined with each other to form a linear superconductor. The linear superconductor and the plurality of carbon nanotubes are combined together to form the superconducting wire 30. In the present embodiment, a composite of superconducting wire 30 is obtained.

In one embodiment, the composite wire 15 is sintered in a vacuum on a first temperature below 600° C. to fuse and combine the plurality of superconducting preforms 12 first, and then sintered in a chamber filled with oxygen gas on a second temperature above 600° C. to remove the plurality of carbon nanotubes. The plurality of carbon nanotubes are removed by oxidizing. In the present embodiment, a pure superconducting wire 30 is obtained.

In one embodiment, the composite wire 15 is sintered in a chamber filled with air on a temperature in a range from about 850° C. to about 1100° C. directly to fuse the plurality of superconducting preforms 12 and remove the plurality of carbon nanotubes simultaneously. The sintering time is in a range from about 6 hours to about 24 hours. In the present embodiment, a pure superconducting wire 30 is obtained.

Furthermore, the composite wire 15 can be placed on a substrate during sintering so that the plurality of superconducting preforms 12 can be supported by the substrate. When the plurality of superconducting preforms 12 are fused and not combined with each other to form a linear superconductor, the plurality of carbon nanotubes are removed by oxidizing, and the plurality of fused superconducting preforms 12 falls apart easily. The substrate can be made of material with a melting point above the sintering temperature, such as silicon or quartz.

Figure 5:
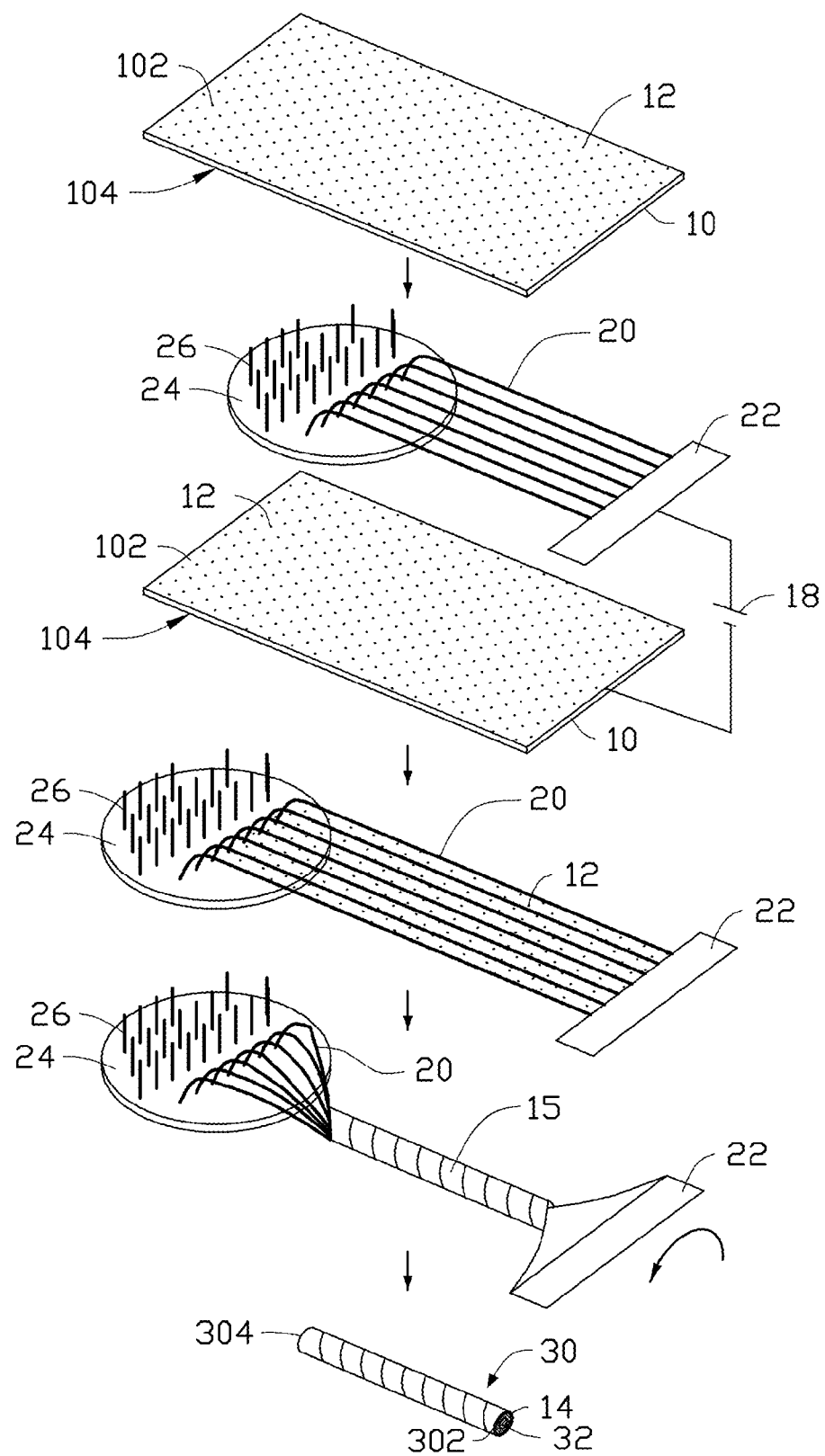
FIG. 5 is a flowchart of another embodiment of a method for making a superconducting wire.

Referring to FIG. 5, a method for making a superconducting wire 30 of one embodiment includes the following steps:

step (S21), providing a plurality of superconducting preforms 12 on a carrier 10;

step (S22), providing a carbon nanotube array 26 on a substrate 24;

step (S23), pulling out a drawn carbon nanotube film 20 from the carbon nanotube array 26;

step (S24), placing the drawn carbon nanotube film 20 spaced from and opposite to the carrier 10, wherein the plurality of superconducting preforms 12 are between the drawn carbon nanotube film 20 and the carrier 10;

step (S25), moving the plurality of superconducting preforms 12 from the carrier 10 onto the drawn carbon nanotube film 20 by applying an electric field between the drawn carbon nanotube film 20 and the carrier 10;

step (S26), making a composite wire 25 by twisting the drawn carbon nanotube film 20 with the plurality of superconducting preforms 12 thereon; and step (S27), sintering the composite wire 25.

In step (S21), the carrier 10 is a metal plate having a first surface 102 and a second surface 104 opposite to the first surface 102. The plurality of superconducting preforms 12 are formed on the first surface 102.

In step (S22), the carbon nanotube array 26 includes a plurality of carbon nanotubes that are substantially parallel to each other and substantially perpendicular to the substrate 24. The carbon nanotube array 26 can be made by the substeps of: step (S221) providing a substantially flat and smooth substrate; step (S222) forming a catalyst layer on the substrate; step (S223) annealing the substrate with the catalyst layer in air at a temperature approximately ranging from 700° C. to 900° C. for about 30 to 90 minutes; step (S224) heating the substrate with the catalyst layer to a temperature approximately ranging from 500° C. to 740° C. in a furnace with a protective gas therein; and step (S225) supplying a carbon source gas to the furnace for about 5 to 30 minutes and growing the carbon nanotube array on the substrate.

In step (S23), drawn carbon nanotube film 20 can be pulled out using a conductive tool 22. The conductive tool 22 can be metal clips or metal tweezers.

In one embodiment, pulling out the drawn carbon nanotube film 20 includes the substeps of: step (S231) selecting one or more of carbon nanotubes in a predetermined width from the carbon nanotube array 26; and step (S232) pulling the selected carbon nanotubes to form nanotube segments at an even and uniform speed to achieve the drawn carbon nanotube film 20.

In step (S24), the drawn carbon nanotube film 20 is placed above the carrier 10 directly after being pulled out from the carbon nanotube array 26. The distance between the drawn carbon nanotube film 20 and the plurality of superconducting preforms 12 can be in a range from about 100 micrometers to about 1 centimeter.

In step (S25), the positive electrode of the power source 18 is electrically connected to the conductive tool 22 and the negative electrode of the power source 18 is electrically connected to the carrier 10.

In step (S26), one end of the drawn carbon nanotube film 20 is connected to the carbon nanotube array 26 and the other end of the drawn carbon nanotube film 20 is connected to the conductive tool 22. The drawn carbon nanotube film 20 is twisted by turning the conductive tool 22.

Furthermore, step (S23), step (S24), step (S25) and step (S26) can be performed simultaneously and continuously. The drawn carbon nanotube film 20 is successively pulled out from the carbon nanotube array 26 and successively twisted to form the composite wire 25, and the plurality of superconducting preforms 12 are successively moved on to the drawn carbon nanotube film 20 between the composite wire 25 and the carbon nanotube array 26. Thus, the product efficiency is improved.

In step (S27), the composite wire 25 can be cut into a certain length before sintering.

Referring to FIGS. 6-9, the superconducting wire 30 of one embodiment includes a linear superconductor 32 and a carbon nanotube structure 38 on an outer surface of the linear superconductor 32. The linear superconductor 32 includes a linear core 36 and a whorl 34 located on outer surface of the linear core 36 and extending helically around an axial direction of the linear core 36. A groove 35 is defined along the whorl 34 and extends helically around the axial direction of the linear core 36.

The linear superconductor 32 is formed by the plurality of superconducting preforms 12 during sintering the composite wire 15. The plurality of superconducting preforms 12 are fused and combined to form the linear superconductor 32 during sintering. Thus, the material of the linear superconductor 32 can be bismuth oxide, lanthanum barium copper oxide, yttrium barium copper oxide composite, thallium barium calcium copper oxide composite, copper oxide, or gold-indium alloy.

Figure 6:
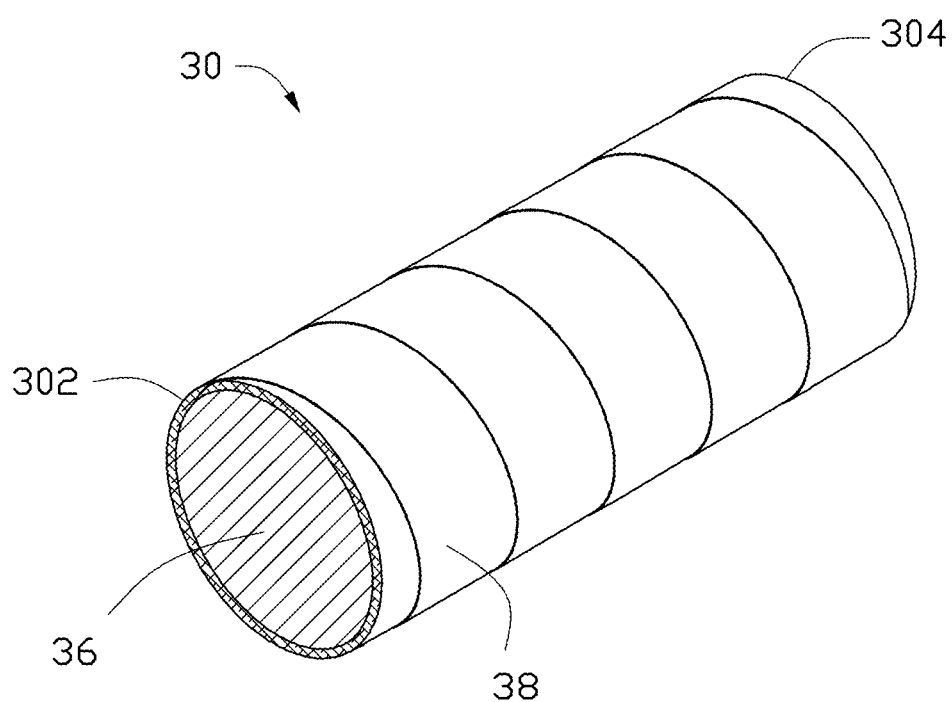
FIG. 6 is a schematic view of one embodiment of a superconducting wire.
Figure 8:
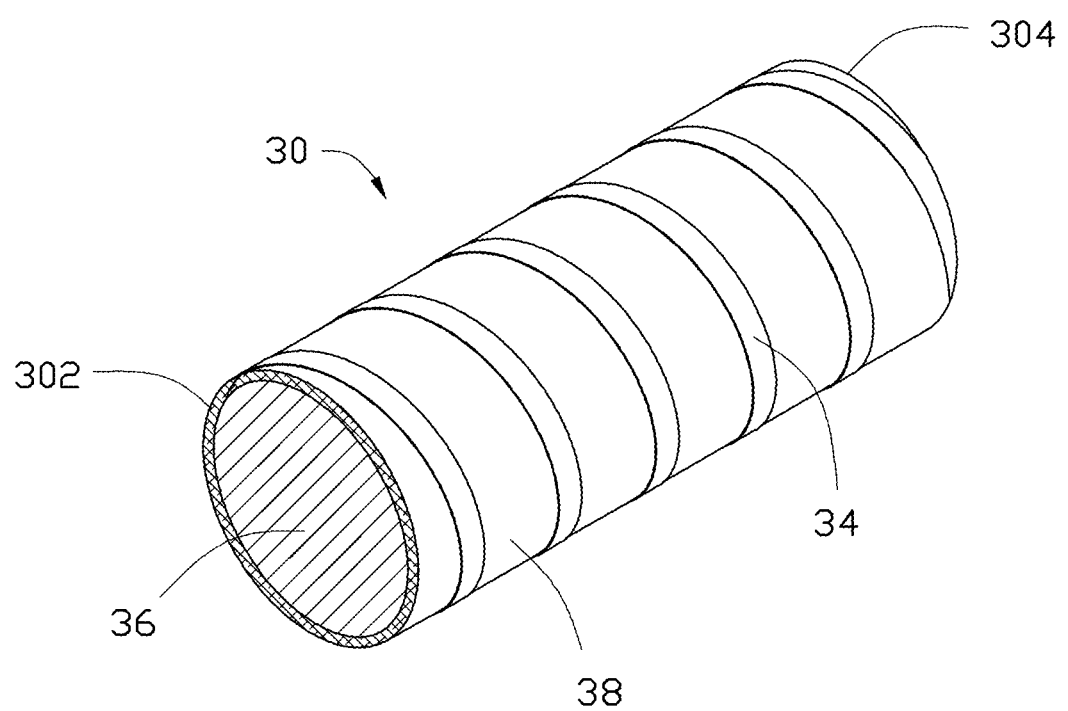
FIG. 8 is a schematic view of another embodiment of a superconducting wire.
Figure 9:
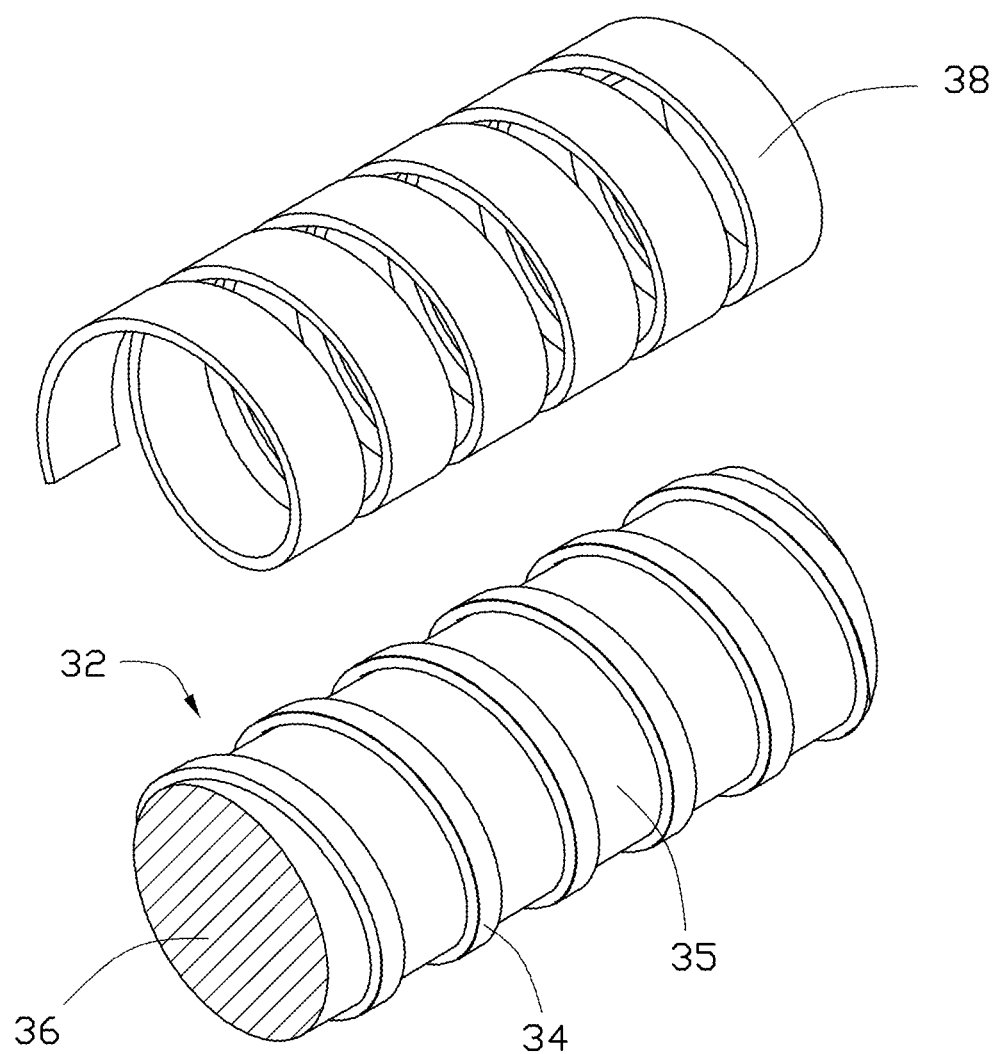
FIG. 9 is an exploded view of the superconducting wire of FIG. 8.

The whorl 34 and the linear core 36 form an integrated structure. The linear superconductor 32 includes a first end 302 and a second end 304 opposite to the first end 302. The linear core 36 extends along a direction from the first end 302 to the second end 304. The whorl 34 and the groove 35 extend helically along a direction from the first end 302 to the second end 304. The widths of the whorl 34 and the groove 35 depend on the stretching force of the carbon nanotube layer 14 during twisting. The greater the stretching force, the smaller the width of the whorl 34 and the greater the width of the groove 35. The width of the whorl 34 can be in a range from about 0.5 micrometers to about 5 micrometers. In one embodiment, the stretching force is about 0.01 Newton, the width of the whorl 34 is about 1 micrometer. The width of the groove 35 can be so slight that the adjacent whorls 34 are almost in contact with each other as shown in FIGS. 6-7. The width of the groove 35 can also be large enough that the adjacent whorls 34 are spaced from each other as shown in FIGS. 8-9.

The carbon nanotube structure 38 can be located on the whorl 34 as shown in FIGS. 6-7. Alternatively, the carbon nanotube structure 38 can be located on the linear core 36 and in the groove 35 as shown in FIGS. 8-9. The carbon nanotube structure 38 winds helically around the linear core 36. The manner of the carbon nanotube structure 38 winding the linear core 36 is the same as the manner of the whorl 34 winding the linear core 36. The carbon nanotube structure 38 extends helically along a direction from the first end 302 to the second end 304. The length of the carbon nanotube structure 38 is the same as the length of the whorl 34. In one embodiment, the carbon nanotube structure 38 includes a plurality of carbon nanotubes joined end to end by van der Waals attractive force between and arranged helically along an axial direction of the linear core 36. A plurality of gaps is defined between the plurality of carbon nanotubes. The linear superconductor 32 can permeate into the plurality of gaps.

Figure 10:
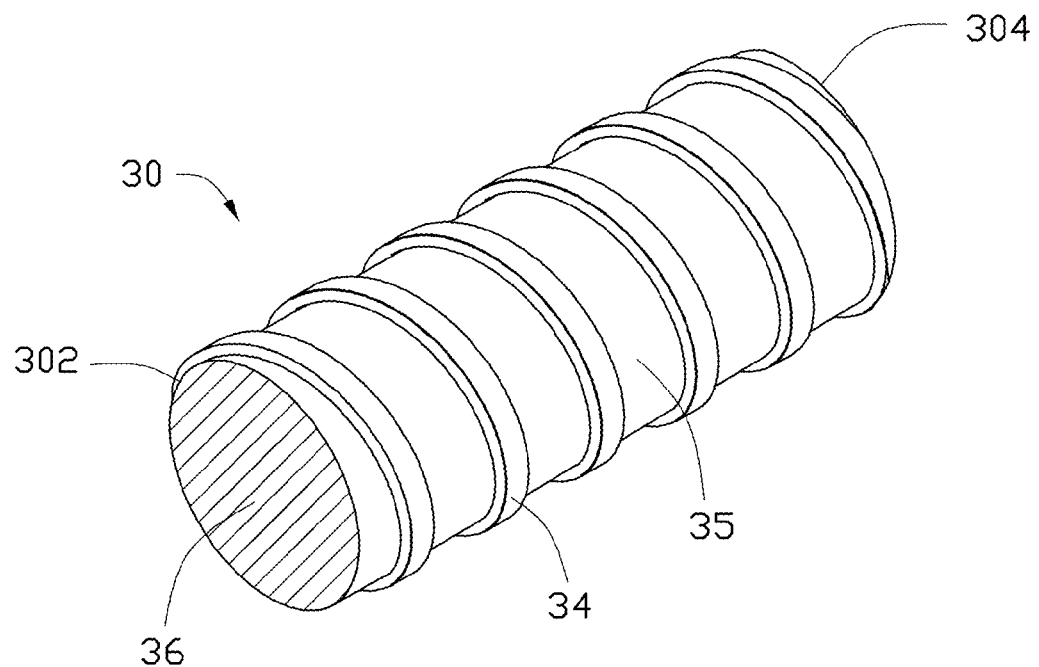
FIG. 10 is a schematic view of another embodiment of a superconducting wire.
Figure 11:
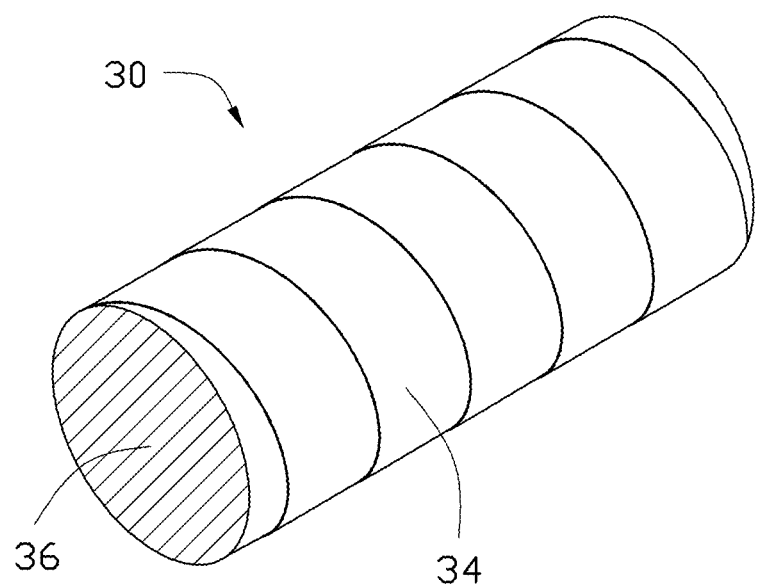
FIG. 11 is a schematic view of another embodiment of a superconducting wire.

Referring to FIGS. 10-11, the superconducting wire 30 of another embodiment includes a linear core 36 and a whorl 34 located on an outer surface of the linear core 36 and extending helically around an axial direction of the linear core 36. The whorl 34 and the linear core 36 form an integrated structure.

The superconducting wire 30 includes a first end 302 and a second end 304 opposite to the first end 302. The whorl 34 extends helically along a direction from the first end 302 to the second end 304. The width of the whorl 34 depends on the stretching force of the carbon nanotube layer 14 during twisting. The greater the stretching force, the smaller the width of the whorl 34. The width of the whorl 34 can be in a range from about 0.5 micrometers to about 5 micrometers. In one embodiment, the stretching force is about 0.01 Newton, and the width of the whorl 34 is about 1 micrometer.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A superconducting wire comprising:
a free standing linear superconductor consisting of a superconducting material, wherein the linear superconductor comprises a linear core and a whorl located on outer surface of the linear core and extending helically around an axial direction of the linear core, and a groove is defined along the whorl and extends helically around the axial direction of the linear core; and
a carbon nanotube structure located on the linear superconductor and arranged helically along an axial direction of the linear superconductor, wherein the carbon nanotube structure is a carbon nanotube strip helically extending to form a free standing hollow pipe, and a gap is defined by spirals of the carbon nanotube strip and helically extends as a manner of the of the carbon nanotube strip.

2. The superconducting wire of claim 1, wherein the whorl and the linear core form an integrated structure.

3. The superconducting wire of claim 1, wherein a width of the whorl is in a range from about 0.5 micrometers to about 5 micrometers.

4. The superconducting wire of claim 1, wherein the linear superconductor is located in the hollow pipe, and the whorl is embedded in the gap of the hollow pipe.

5. The superconducting wire of claim 1, wherein the carbon nanotube structure comprises a plurality of carbon nanotubes entangled with each other.

6. The superconducting wire of claim 1, wherein the superconducting material is selected from the group consisting of lanthanum barium copper oxide, yttrium barium copper oxide composite, thallium barium calcium copper oxide composite, and gold-indium alloy.

* * * * *